(12) United States Patent
Bonam et al.

(10) Patent No.: US 11,049,844 B2
(45) Date of Patent: Jun. 29, 2021

(54) SEMICONDUCTOR WAFER HAVING TRENCHES WITH VARIED DIMENSIONS FOR MULTI-CHIP MODULES

(71) Applicant: International Business Machines Corporation, Armonk, NY (US)

(72) Inventors: Ravi K. Bonam, Albany, NY (US); Mukta Ghate Farooq, Hopewell Junction, NY (US); Dinesh Gupta, Hopewell Junction, NY (US); James Kelly, Schenectady, NY (US); Kamal K. Sikka, Poughkeepsie, NY (US); Joshua M. Rubin, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/458,554

(22) Filed: Jul. 1, 2019

(65) Prior Publication Data
US 2021/0005573 A1 Jan. 7, 2021

(51) Int. Cl.
*H01L 25/00* (2006.01)
*H01L 21/48* (2006.01)
(Continued)

(52) U.S. Cl.
CPC ............ *H01L 25/00* (2013.01); *H01L 21/481* (2013.01); *H01L 21/8221* (2013.01);
(Continued)

(58) Field of Classification Search
CPC ....... H01L 23/13; H01L 23/367; H01L 23/34; H01L 23/40; H01L 23/42; H01L 23/44;
(Continued)

(56) References Cited

U.S. PATENT DOCUMENTS 6,642,081 B1 * 11/2003 Patti .................. H01L 21/76898
257/E21.597
9,123,546 B2 9/2015 Lin et al.
(Continued)

FOREIGN PATENT DOCUMENTS

CN 104649221 A 5/2015
CN 104851816 A 8/2015
(Continued)

OTHER PUBLICATIONS

Disclosed Anonymously, "Dual Height LEvels for Multiple Chips Package" IP.com Electronic Publication Date: Mar. 11, 2019; IPCOM000180548D (3 pages).
(Continued)

*Primary Examiner* — Galina G Yushina
(74) *Attorney, Agent, or Firm* — Cantor Colburn LLP; Abdy Raissinia

(57) ABSTRACT

A semiconductor wafer includes a first substrate and a first etch stop layer formed on the first substrate. The etch stop layer has an opening. The semiconductor wafer further includes a second substrate and a second etch stop layer formed on the second substrate. The first substrate is bonded on top of the second substrate such that the first etch stop layer is positioned between the first substrate and the second substrate. A trench is formed in the opening.

4 Claims, 6 Drawing Sheets

(51) Int. Cl.
*H01L 23/13* (2006.01)
*H01L 21/822* (2006.01)
*H01L 27/146* (2006.01)
*H01L 23/367* (2006.01)

(52) U.S. Cl.
CPC ........ *H01L 23/13* (2013.01); *H01L 27/14687* (2013.01); *H01L 23/367* (2013.01)

(58) Field of Classification Search
CPC ............. H01L 23/3114; H01L 23/3128; H01L 33/0093; H01L 21/481; H01L 21/561; H01L 24/94; H01L 25/00; H01L 27/14632; H01L 27/14687
See application file for complete search history.

(56) References Cited

U.S. PATENT DOCUMENTS

| | | | |
|---|---|---|---|
| 9,252,054 B2 | 2/2016 | Wu et al. | |
| 9,385,006 B2 | 7/2016 | Lin et al. | |
| 2005/0059238 A1* | 3/2005 | Chen | H01L 21/4871 438/672 |
| 2006/0206173 A1* | 9/2006 | Gertner | A61N 5/0616 607/88 |
| 2008/0007839 A1* | 1/2008 | Deng | G02B 3/0056 359/642 |
| 2008/0124845 A1* | 5/2008 | Yu | H01L 24/73 438/143 |
| 2014/0353787 A1* | 12/2014 | Peng | H01L 27/14667 257/432 |
| 2015/0076682 A1 | 3/2015 | Wu et al. | |
| 2015/0129891 A1 | 5/2015 | Lin et al. | |
| 2015/0279891 A1* | 10/2015 | Chen | H01L 27/1463 257/459 |
| 2018/0350677 A1* | 12/2018 | Engelmann | H01L 25/16 |
| 2018/0362339 A1 | 12/2018 | Wen et al. | |
| 2019/0148336 A1* | 5/2019 | Chen | H01L 24/82 257/774 |

FOREIGN PATENT DOCUMENTS

| | | |
|---|---|---|
| CN | 106876356 A | 6/2017 |
| TW | I609423 B | 12/2017 |
| WO | 2017196257 A1 | 11/2017 |

OTHER PUBLICATIONS

Iyer S. S., "45-nm silicon-on-insulator CMOS technology integrating embedded DRAM for high-performance server and ASIC applications", IBM Journal of Research and Development, vol. 55, No. 3; 2011; pp. 5:1-5:14.

Tsai W.S. et al., "Board Level Realiability of Thinner Stacking Chips Package with Through Silicon Via Interposer", International Microsystems, Packaging, Assembly and Circuits Technology Conference (IMPACT), 2013; pp. 237-240.

* cited by examiner

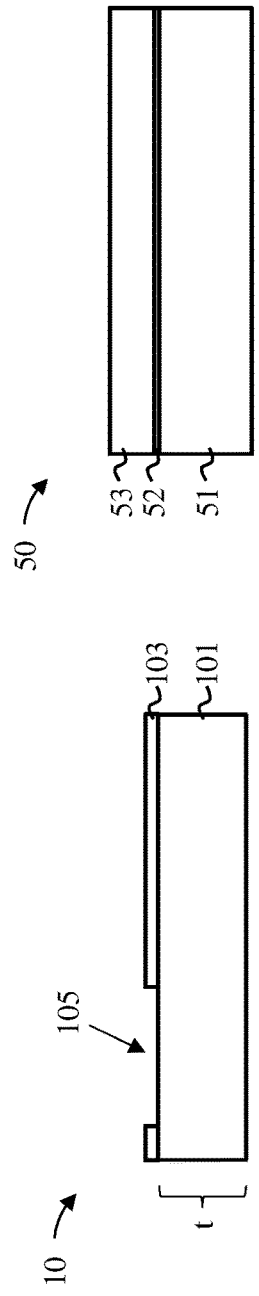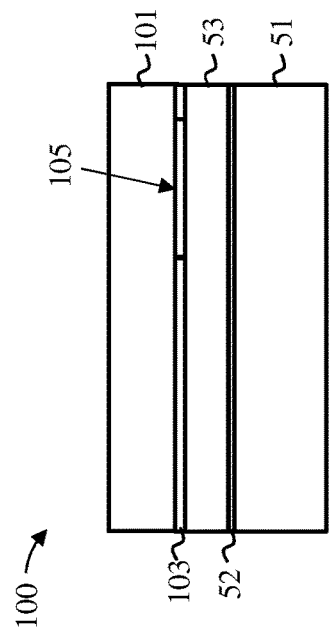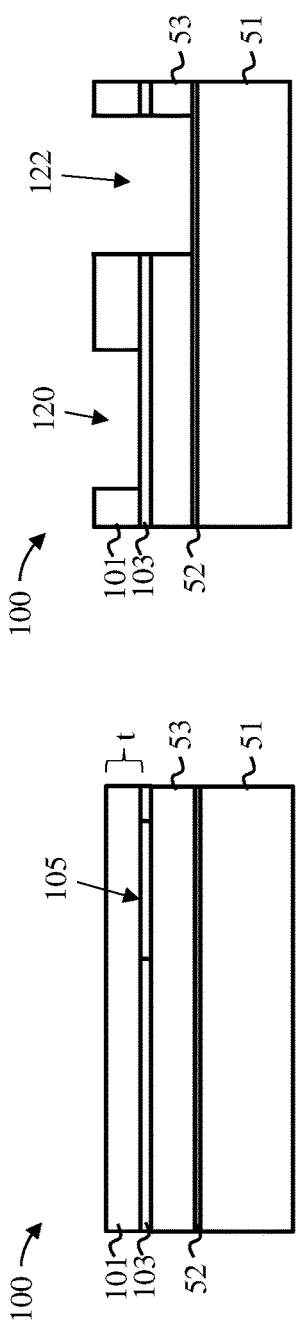

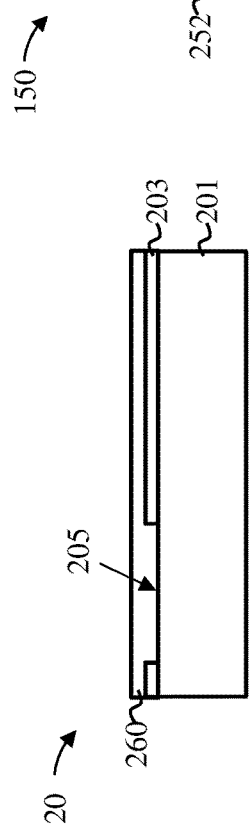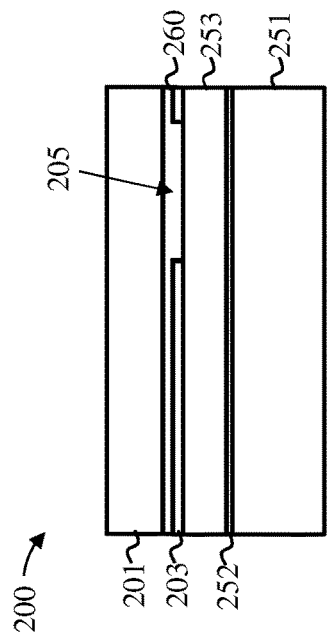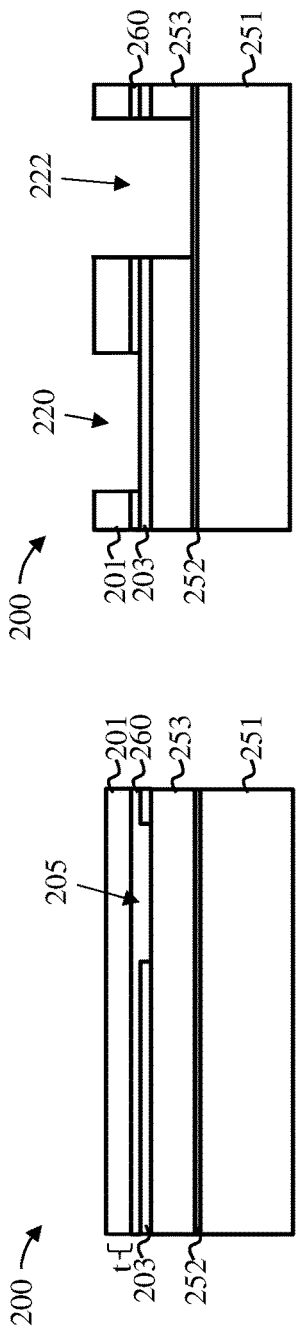

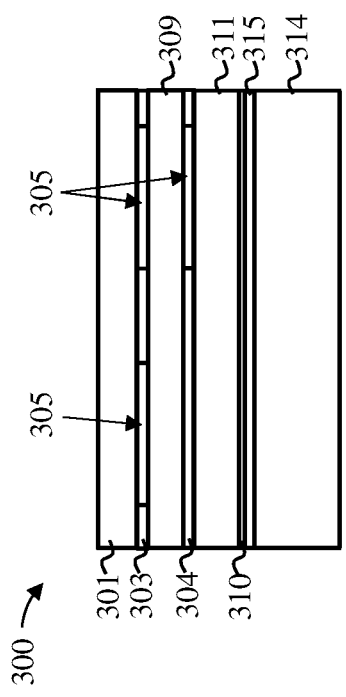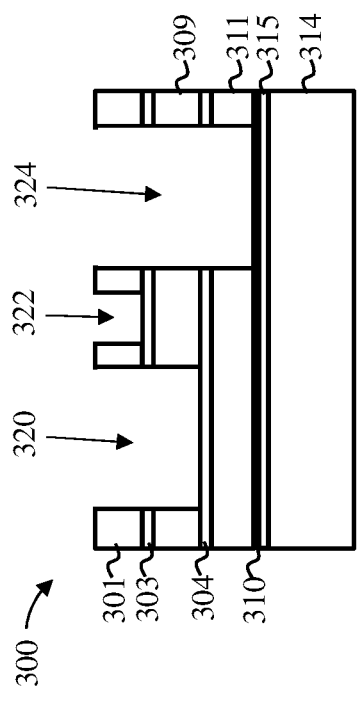

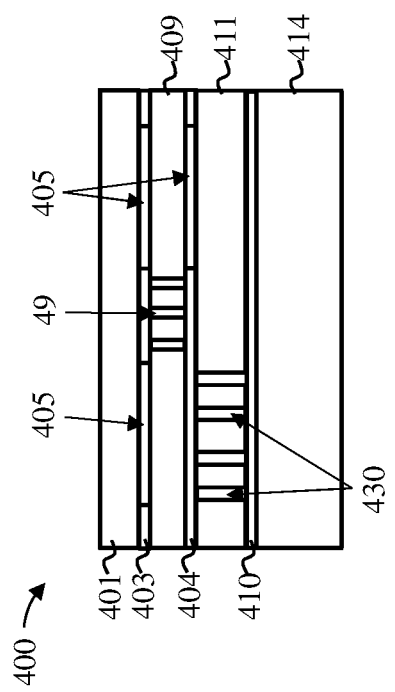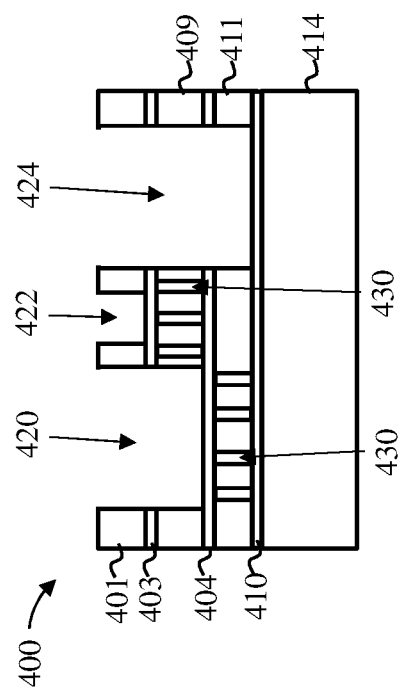

SEMICONDUCTOR WAFER HAVING TRENCHES WITH VARIED DIMENSIONS FOR MULTI-CHIP MODULES

BACKGROUND

The present invention generally relates to fabrication methods and resulting structures for semiconductor wafers. More specifically, the present invention relates to fabrication methods and resulting structures for forming semiconductor wafers having trenches with varied dimensions for multi-chip modules.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., S/D contacts) and other structures that communicatively couple to active regions (e.g., gate, source, and drain) of the device element. Layers of interconnections (also known as metallization layers) are formed above these logical and functional layers during the BEOL stage to complete the IC.

SUMMARY

According to a non-limiting embodiment of the present invention, a semiconductor wafer is provided that includes a first substrate and a first etch stop layer formed on the first substrate. The etch stop layer has an opening. The semiconductor wafer further includes a second substrate and a second etch stop layer formed on the second substrate. The first substrate is bonded on top of the second substrate such that the first etch stop layer is positioned between the first substrate and the second substrate. A trench is formed in the opening.

Embodiments of the present invention are further directed to a method for fabricating a semiconductor wafer. A non-limiting example of the method includes providing a first substrate, forming a first etch stop layer on the first substrate and forming an opening in the first etch stop layer. The method further includes providing a second substrate and forming a second etch stop layer on the second substrate. In addition, the first substrate is bonded on top of the second substrate such that the first etch stop layer is positioned between the first substrate and the second substrate. The method also includes forming a trench in the opening, where the trench terminates at the second etch stop layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-1E depict cross-sectional views of a semiconductor wafer after fabrication operations for forming trenches having multi-dimensional height, width and depth that can accommodate multiple semiconductor chips of various sizes according to embodiments of the invention, in which:

FIG. 1A depicts a cross-sectional view illustrating a structure that results from performing initial fabrication operations in accordance with embodiments of the invention;

FIG. 1B depicts a cross-sectional view of the structure after fabrication operations in accordance with embodiments of the invention;

FIG. 1C depicts a cross-sectional view of the structure after fabrication operations in accordance with embodiments of the invention;

FIG. 1D depicts a cross-sectional view of the structure after fabrication operations in accordance with embodiments of the invention; and FIG. 1E depicts a cross-sectional view of the structure after fabrication operations in accordance with embodiments of the invention.

FIGS. 2A-2E depict cross-sectional views of a structure after fabrication operations for forming a wafer having a planarizing layer in accordance with embodiments of the invention, in which:

FIG. 2A depicts a cross-sectional view illustrating the structure after initial fabrication operations in accordance with embodiments of this invention;

FIG. 2B depicts a cross-sectional view of the structure after fabrication operations in accordance with embodiments of the invention;

FIG. 2C depicts a cross-sectional view of the structure after fabrication operations in accordance with embodiments of the invention;

FIG. 2D depicts a cross-sectional view of the structure after fabrication operations in accordance with embodiments of the invention; and FIG. 2E depicts a cross-sectional view of the structure after fabrication operations in accordance with embodiments of the invention.

FIGS. 3A-3B depict cross-sectional views of a structure after fabrication operations for forming a wafer that includes a plurality of opening for forming trench regions in accordance with embodiments of the invention, in which:

FIG. 3A depicts a cross-sectional view of the structure after fabrication operations in accordance with embodiments of the invention; and FIG. 3B depicts a cross-sectional view of the structure after fabrication operations in accordance with embodiments of the invention.

FIGS. 4A-4B depict cross-sectional views of a structure after fabrication operations for forming a wafer that includes a micro-cooler for an efficient thermal management, in which:

FIG. 4A depicts a cross-sectional view of the structure after fabrication operations in accordance with embodiments of the invention;

FIG. 4B depicts a cross-sectional view of the structure after fabrication operations in accordance with embodiments of the invention;

Figure 5A:
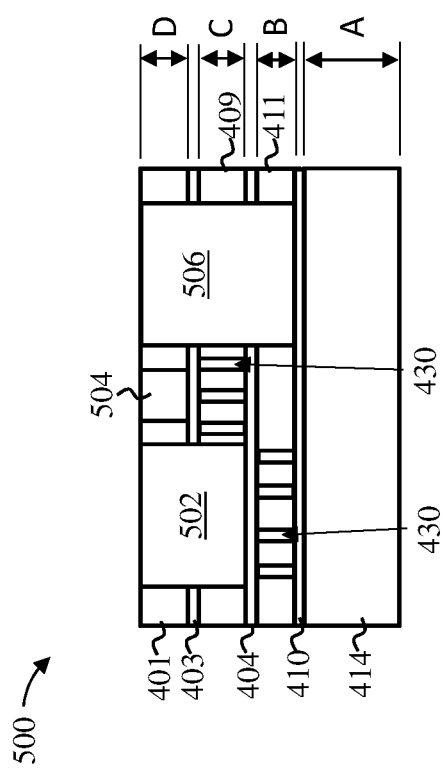
FIG. 5A depicts a cross-sectional view of the structure after fabrication operations in accordance with embodiments of the invention.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in present semiconductor technology, the fabrication of the semiconductor devices includes forming various electronic components on and within semiconductor substrates. For example, semiconductor devices can include transistors, resistors, capacitors, and the like. Semiconductor devices are generally manufactured using two manufacturing processes, i.e., front-end manufacturing, and back-end manufacturing. Front-end manufacturing involves the formation of a plurality of die on the surface of a semiconductor wafer. Each die is typically identical and contains circuits formed by electrically connecting active and passive components. Back-end manufacturing involves separating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. Improvements in back-end processes can result in semiconductor device packages with a smaller footprint by improvements in electrical interconnection and packaging materials.

A fabrication technology known as fan-out wafer-level packaging (FOWLP) has been developed to produce semiconductors of reduced package sizes and pad layout flexibility. FOWLP technology enables external terminals distributing outside of the chip by using a thin-film fan-out redistribution layer (RDL) at a wafer level format. FOWLP technology can benefit from using silicone substrates to achieve layout flexibility, for example, to create trenches with multiple dimensions and proper control of trench's height and depth. As a result, such trenches having well-defined profiles can accommodate silicone-based binding materials and enable integration of multiple semiconductor chips of various nodes and technologies into a planar module.

Turning now to an overview of the aspects of the invention, embodiments of the invention provide a semiconductor wafer with trenches having well-defined multi-dimensional height, width, and depth dimensions that can accommodate multiple semiconductor chips of various sizes and of multiple nodes and technologies into a planar module. It is to be understood that the described embodiments are merely illustrative of the claimed structures and methods that can be embodied in various forms.

Turning now to a more detailed description of aspects of the present invention, FIGS. 1A-1E depict cross-sectional views of a portion of a semiconductor wafer/structure 100 after fabrication operations for forming trenches 120, 122 (shown in FIG. 1E) having multi-dimensional height, width and depth that can accommodate multiple semiconductor chips of various sizes according to embodiments of the invention. More specifically, FIG. 1A depicts a cross-sectional view illustrating an initial wafer/structure 10 that results from performing initial fabrication operations in accordance with embodiments of this invention. As shown in FIG. 1A, known fabrication operations have been used to form the wafer/structure 10 having a bulk substrate 101 and an etch stop layer 103. The etch stop layer 103 further configured to form an opening 105 as arranged and shown in FIG. 1A. The opening 105 can be formed by a known fabrication technique after the initial blanket deposition of the etch stop layer 103 on top of the bulk substrate 101. In embodiments of the invention, the substrate 101 is substantially planarized and can be a semiconductor material including, but not limited to, silicon (Si), silicon germanium (SiGe), silicon carbide (SiC), silicon-germanium-carbon (SiGeC) or other like semiconductor materials. The substrate can have a thickness "t" that corresponds to a thickness of a semiconductor chip (not shown) to be embedded in a trench 120 (shown in FIG. 1E). The etch stop layer 103 can be an insulator, such as an oxide, nitride or oxynitride. Alternatively, the etch stop layer 103 can be another semiconductor material which can be removed selectively after bonding (shown in FIG. 1C) and also serve as an etch stop to remove the portions of the substrate 101 to form trenches in the wafer/structure 100, as shown in FIG. 1E.

FIG. 1B depicts a cross-sectional view of a bottom wafer structure 50 that forms the bottom portion of the wafer/structure 100, as shown in FIG. 1C. The bottom wafer structure 50 can be a silicon-on-insulator (SOI) structure. For example, the SOI structure can be formed by a layer transfer process in which a crystalline silicon substrate 53 is bonded to the top of, for example, a silicon dioxide layer 52, previously formed on a crystalline silicon wafer 51. Van der Wals forces cause the two wafers to adhere, allowing a stronger bond to be formed thereafter by heating the conjoined wafers in an anneal step.

In FIG. 1C, the structure 10 shown in FIG. 1A is flipped and bonded to the bottom wafer structure 50. Known bonding techniques can be used to form the wafer 100 shown in FIG. 1C. For example, the structure 10 and the bottom wafer structure 50 can be bound by placing the two structures as shown in FIG. 1C and annealing them at a temperature between 600-1200° Centigrade (C.).

In FIG. 1D, known semiconductor fabrication operations have been used to grind and/or polish the substrate 101. For example, chemical mechanical polishing (CMP) process can be used to achieve planarization of the substrate 101 (i.e., a top layer) of the wafer/structure 100. The substrate 101 can have a thickness "t" that corresponds to a thickness of a semiconductor chip (not shown) to be embedded in the trench 120 (shown in FIG. 1E).

In FIG. 1E, known fabrication operations (e.g., etch) have been used to form trench regions 120, 122. The trench region 120 terminates sufficiently deep to expose a top surface of the etch stop layer 103. The trench region 122 terminates sufficiently deep to expose a top surface of the silicon dioxide layer 52. As a result, as shown in FIG. 1E, after recessing the substrates 101, 53 the trench regions 120, 122 are formed to accept semiconductor chips (not shown) to be embedded in the trench regions 120, 122.

FIGS. 2A-2E depict embodiments of the invention wherein a wafer is fabricated to include a planarizing layer. More specifically, FIG. 2A depicts a cross-sectional view of a structure 20 that results from performing initial fabrication operations according to embodiments of the invention. As shown in FIG. 2A, known fabrication operations have been used to form the structure 20 having a bulk substrate 201 and an etch stop layer 203. The etch stop layer 203 further configured to form an opening 105 as arranged and shown in FIG. 2A. The opening 205 can be formed by a known fabrication technique after the initial blanket deposition of the etch stop layer 203 on top of the bulk substrate 201. In embodiments of the invention, the substrate 201 is substantially planarized and can be a semiconductor material including, but not limited to, silicon (Si), silicon germanium (SiGe), silicon carbide (SiC), silicon-germanium-carbon (SiGeC) or other like semiconductor materials. The substrate can have a thickness "t" that corresponds to a thickness of a semiconductor chip (not shown) to be embedded in, for example, a trench 220 (shown in FIG. 2E). According to embodiments of the present invention, a planarizing layer 260 is formed over the etch stop layer 203 and the opening 205. The planarizing layer 260 can be an acrylic polymer, for example, polyacrylate.

FIG. 2B depicts a cross-sectional view of a bottom wafer structure 150 that forms the bottom portion of the wafer/structure 200 (shown in FIG. 1C). The bottom wafer structure 150 can be a silicon-on-insulator (SOI) structure that includes a crystalline silicon substrate 253 is bonded to the top of, for example, a silicon dioxide layer 252, previously formed on a crystalline silicon wafer 251.

In FIG. 2C, the structure 20 (shown in FIG. 2A) is flipped and bonded to the bottom wafer structure 150 (FIG. 2B). As a result, the planarizing layer 260 is positioned between the substrate 253 and the bulk substrate 201. This improves interface between the layers, thereby strengthening the bonding between the two structures. Known bonding techniques can be used to form the wafer 200 shown in FIG. 2C.

In FIG. 2D, known semiconductor fabrication operations have been used to grind and/or polish the substrate 201. The substrate 201 can have a thickness "t" that corresponds to a thickness of a semiconductor chip (not shown) to be embedded in the trench 220 (shown in FIG. 1E).

In FIG. 2E, known fabrication operations (e.g., etch) have been used to form trench regions 220, 222. The trench region 220 terminates sufficiently deep to expose a top surface of the etch stop layer 203. The trench region 222 terminates sufficiently deep to expose a top surface of the silicon dioxide layer 252. As a result, as shown in FIG. 2E, after recessing the substrates 201, 253 the trench regions 220, 222 are formed to accept semiconductor chips (not shown) to be embedded in the trench regions 220, 222.

FIGS. 3A-3B depict embodiments of the invention wherein a wafer is formed that includes a plurality of opening for forming trench regions. As shown in FIG. 3A, known fabrication operations and processes described in FIGS. 1A-1C and 2A-2C have been used to form a wafer/structure 300. The structure 300 can include a plurality of substrate layers 301, 309, 311, 314 and a plurality of etch stop layers 303, 304, and 310 formed between the substrate layers 301, 309, 311, 314, as shown in FIG. 3A. The etch stop layers 303, 304 have openings 305 as arranged as shown in FIG. 3A. The openings 305 can be formed by a known fabrication technique after the initial blanket deposition of the etch stop layers 303, 304. In addition, wafer/structure 300 can include a bonding layer 315 having low thermal resistance to dissipate heat generated by an IC. The bonding layer 315 can be a metal or other low thermal resistance material.

In embodiments of the invention, the substrate layers 301, 309, 311, 314 are substantially planarized and can be a semiconductor material including, but not limited to, silicon (Si), silicon germanium (SiGe), silicon carbide (SiC), silicon-germanium-carbon (SiGeC) or other like semiconductor materials. The etch stop layers 303, 304, 310 can be formed from insulators, such as an oxide, nitride or oxynitride.

In FIG. 3B, known fabrication operations (e.g., etch) have been used to form trench regions 320, 322, 324. The trench region 320 terminates sufficiently deep to expose a top surface of the etch stop layer 304. The trench region 322 terminates sufficiently deep to expose a top surface of the etch stop layer 303. The trench region 324 terminates sufficiently deep to expose a top surface of the layer 310. As a result, as shown in FIG. 3B, after recessing the substrates 301, 309, 311 the trench regions 320, 322, 324 are formed to accept semiconductor chips (not shown) to be embedded in the trench regions 320, 322, 324.

FIGS. 4A-5B depict embodiments of the invention wherein a wafer is formed to include a micro-cooler structure for an efficient thermal management. As shown in FIG. 4A, known fabrication operations and processes described in FIGS. 1A-1C and 2A-2C have been used to form a wafer/structure 400 having a plurality of substrate layers 401, 409, 411, 414 and a plurality of etch stop layer 403, 404, 410 formed between the substrate layers 401, 409, 411, 414, as shown in FIG. 3A. The etch stop layers 403, 404 have openings 405 as arranged and shown in FIG. 4A. The openings 405 can be formed by a known fabrication technique after the initial blanket deposition of the etch stop layers 403, 404. In addition, micro-cooler structures 430, 49 can be embedded by known fabrication processes in, for example, the substrate layers 409, 411.

In embodiments of the invention, the substrate layers 401, 409, 411, 414 are substantially planarized and can be a semiconductor material including, but not limited to, silicon (Si), silicon germanium (SiGe), silicon carbide (SiC), silicon-germanium-carbon (SiGeC) or other like semiconductor materials. The etch stop layers 403, 404, 410 can be formed from insulators, such as an oxide, nitride or oxynitride.

In FIG. 4B, known fabrication operations (e.g., etch) have been used to form trench regions 420, 422, 424. The trench region 420 terminates sufficiently deep to expose a top surface of the etch stop layer 404. The trench region 422 terminates sufficiently deep to expose a top surface of the etch stop layer 403. The trench region 424 terminates sufficiently deep to expose a top surface of the layer 410. As a result, as shown in FIG. 4B, after recessing the substrates 401, 409, 411 the trench regions 420, 422, 424 are formed to accept semiconductor chips (not shown) to be embedded in the trench regions 420, 422, 424. In some embodiments of the invention, portions of the substrate 401 between the trench regions 420 and 424 are removed to merge the trench regions 420, 422, and 424 into a single large area barrier free trench (not depicted).

After fabrication processes escribed herein, in FIGS. 1A-4B, a semiconductor chips (not shown) can be placed face-up (where contacts facing up). Subsequently, a dielectric material can be deposited to planarize the chips to be substantially coplanar. After the dielectric material deposition, known BEOL process can be performed to form interconnections between the planarized components. Wiring is then build up further to enable a thicker wiring level (e.g. Cu RDL), to enable power from laminate to be routed into the die. Termination pads and C4 (to included Cu pillars if required) can be them formed. The sub-assembly is then diced out and assembled onto a laminate.

In FIG. 5A, integrated chips 502, 504, and 506 are positioned in the trench regions 420, 422, and 424, respectively. In some embodiments of the invention, the size (thickness) of some or all of the integrated chips 502, 504, and 506 are different. For example, the integrated chip 502 can have a thickness of 330 nm, the integrated chip 504 can have a thickness of 250 nm, and the integrated chip 506 can have a thickness of 400 nm, although other thicknesses are within the contemplated scope of the invention.

As discussed previously herein, the thicknesses of the various substrates 414, 411, 409, and 401 can be carefully controlled using, for example, buried etch stop layers and planarization layers according to one or more embodiments of the present invention. In this manner, the depth of the trench regions 420, 422, and 424 can be carefully controlled prior to forming or inserting the integrated chips 502, 504, and 506. In some embodiments of the invention, the thicknesses A, B, C, and D of the various substrates 414, 411, 409, and 401, respectively, can be controlled according to one or more embodiments of the present invention to ensure that the exposed surfaces of each of the integrated chips 502, 504, and 506 are coplanar.

In some embodiments of the invention, the thicknesses A, B, C, and D are controlled to ensure that the final total thickness (the final bonded wafer thickness) is within a standard wafer thickness (e.g., about 775 um). In this manner, various chip thicknesses can be integrated within a single semiconductor structure (e.g., a planar module). Due to this flexibility, the integrated chips can be based on different process nodes (e.g., 10 nm, 7 nm, 20 nm, etc.) and/or can even be sourced from different suppliers. Moreover, while shown with three integrated chips (e.g., the integrated chips 502, 504, and 506) for ease of discussion, it is understood that a semiconductor device having any number of chips (each having a different or arbitrary thickness) can be formed in a planar package according to one or more embodiments of the present invention.

Figure 5B:
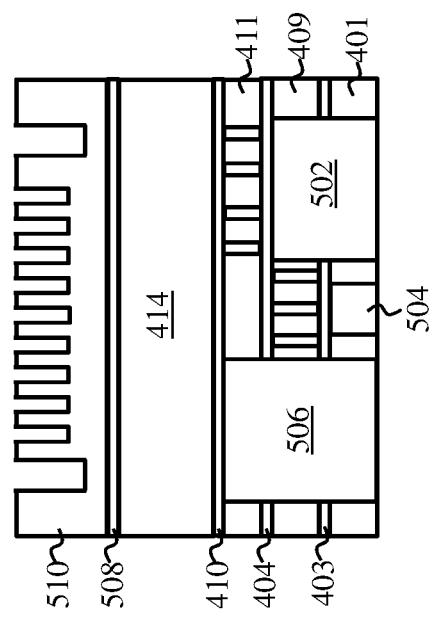
FIG. 5B depicts a cross-sectional view of the structure after fabrication operations in accordance with embodiments of the invention.

In FIG. 5B, a bonding layer 508 and a micro-cooler structure 510 can be formed on a surface of the substrate 414 opposite the integrated chips 502, 504, and 506. The micro-cooler structure 510 can be formed according to one or more embodiments of the present invention. In some embodiments of the invention, the micro-cooler structure 510 is formed in a similar manner as the micro-cooler structure 430, discussed previously herein. In this manner, micro-cooler structures can be defined as portions of the substrate having trenches of various trench depths that can be customized to a particular application (based on, e.g., chip arrangement, chip number, thermal requirements, thermal distribution, etc.).

Figure 6:
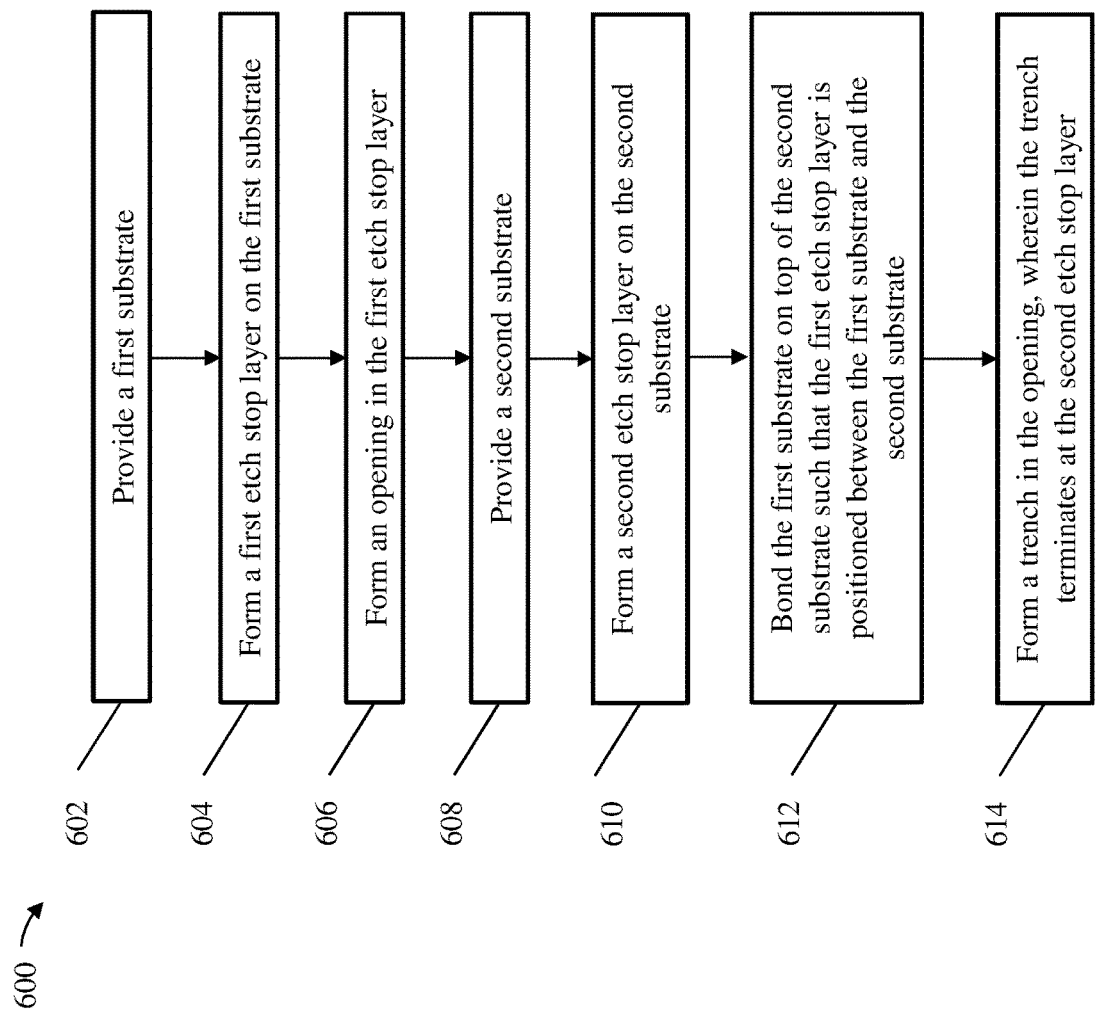
FIG. 6 depicts a flow diagram illustrating a method according to one or more embodiments of the invention.

FIG. 6 depicts a flow diagram 600 illustrating a method for forming a semiconductor device according to one or more embodiments of the invention. As shown at block 602, a first substrate is provided. In some embodiments of the invention, the first substrate includes silicone. At block 604, a first etch stop layer is formed on the first substrate. At block 606, an opening is formed in the first etch stop layer.

At block 608, a second substrate is provided. In some embodiments of the invention, the second substrate includes a SOI structure. At block 610, a second etch stop layer is formed on the second substrate. In some embodiments of the invention, the second etch stop layer includes a material selected from the group consisting of an oxide, nitride or oxynitride.

At block 612, the first substrate is bonded on top of the second substrate such that the first etch stop layer is positioned between the first substrate and the second substrate. At block 614, a trench is formed in the opening. In some embodiments of the invention, the trench terminates at the second etch stop layer.

The method can further include forming a planarizing layer. In some embodiments of the invention, the planarizing layer includes an acrylic polymer. In some embodiments of the invention, a bonding layer is formed between the first substrate and the second substrate. In some embodiments of the invention, the bonding layer includes a metal. In some embodiments of the invention, a micro-cooler structure is formed in the first substrate and/or the second substrate.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor wafer, the method comprising:
   providing a first substrate;
   forming a first etch stop layer on a top surface of the first substrate;
   bonding a second substrate directly to a top surface of the first etch stop layer; forming a second etch stop layer on a top surface of the second substrate, wherein a first opening is patterned in the second etch stop layer, the first opening exposing a portion of the second substrate;
   forming a third substrate directly on a top surface of the second etch stop layer;
   forming a third etch stop layer on a top surface of the third substrate, wherein a second opening and a third opening are patterned in the third etch stop layer, the second opening exposing a first portion of the third substrate and the third opening exposing a second portion of the third substrate, wherein the third opening is vertically aligned over the first opening;
   forming a first trench by removing the exposed first portion of the third substrate in the second opening, wherein the first trench terminates at the second etch stop layer; and
   forming a second trench by removing the exposed second portion of the third substrate in the third opening and the exposed portion of the second substrate in the first opening, wherein the second trench terminates at the first etch stop layer.

2. The method according to claim 1, wherein the first substrate comprises silicone.

3. The method according to claim 1 further comprising forming a micro-cooler structure embedded between the third etch stop layer and the second etch stop layer.

4. The method according to claim 1, further comprising forming a micro-cooler structure embedded between the first etch stop layer and the second etch stop layer.

* * * * *